United States Patent [19]
Golden et al.

[11] Patent Number: 5,618,751
[45] Date of Patent: Apr. 8, 1997

[54] METHOD OF MAKING SINGLE-STEP TRENCHES USING RESIST FILL AND RECESS

[75] Inventors: Kevin M. Golden, Wallkill, N.Y.; Pai-Hung Pan, Boise, Id.; Kevin J. Stewart, Murrysville, Pa.; Alan C. Thomas, Hughsonville, N.Y.

[73] Assignee: International Business Machines Corporation, Armonk, N.Y.

[21] Appl. No.: 652,063

[22] Filed: May 23, 1996

[51] Int. Cl.⁶ .................................................. H01L 21/8242
[52] U.S. Cl. ........................ 438/392; 438/949; 438/561
[58] Field of Search ............................. 437/52, 60, 919, 437/229, 164

[56] References Cited

U.S. PATENT DOCUMENTS

| | | |
|---|---|---|
| 4,665,007 | 5/1987 | Cservak et al. . |
| 4,666,556 | 5/1987 | Fulton et al. . |
| 4,906,590 | 3/1990 | Kanetaki et al. . |
| 4,945,069 | 7/1990 | Carter . |
| 4,994,409 | 2/1991 | Yoon et al. . |
| 4,999,312 | 3/1991 | Yoon ................................... 437/52 |
| 5,096,849 | 3/1992 | Beilstein, Jr. et al. . |
| 5,521,114 | 5/1996 | Rajeevakumar ..................... 437/60 |
| 5,545,583 | 8/1996 | Lam et al. ........................... 437/52 |

FOREIGN PATENT DOCUMENTS 63-280420 11/1988 Japan .

OTHER PUBLICATIONS

"Trench Capacitor Using Selective Polysilicon"; B.J. Ginsberg and J.L. Mauer; IBM Technical Disclosure Bulletin, vol. 31, No. 2, Jul. 1988; pp. 421–422.

Primary Examiner—John Niebling
Assistant Examiner—Richard A. Booth
Attorney, Agent, or Firm—Whitham, Curtis, Whitham & McGinn; Charles W. Peterson, Jr.

[57] ABSTRACT

A trench capacitor with a buried plate is formed with a single etching process by the expedient of filling the trench so formed and lined with diffusion source material with resist by baking and reflowing the resist which also serves to adjust exposure sensitivity of the resist such that exposure and development of the resist removes the resist to a repeatable and uniform depth. Remaining resist allows etching of the diffusion source layer to a very accurate dimension. Thus only a readily formed oxide or TECS layer is needed to confine impurities during diffusion to form the buried plate. An isolation collar can be formed after recess of the fill to avoid formation of step corners and erosion of the isolation collar by repeated fill and etch back processes while permitting maximum capacitance to be achieved for a given trench "footprint".

20 Claims, 3 Drawing Sheets

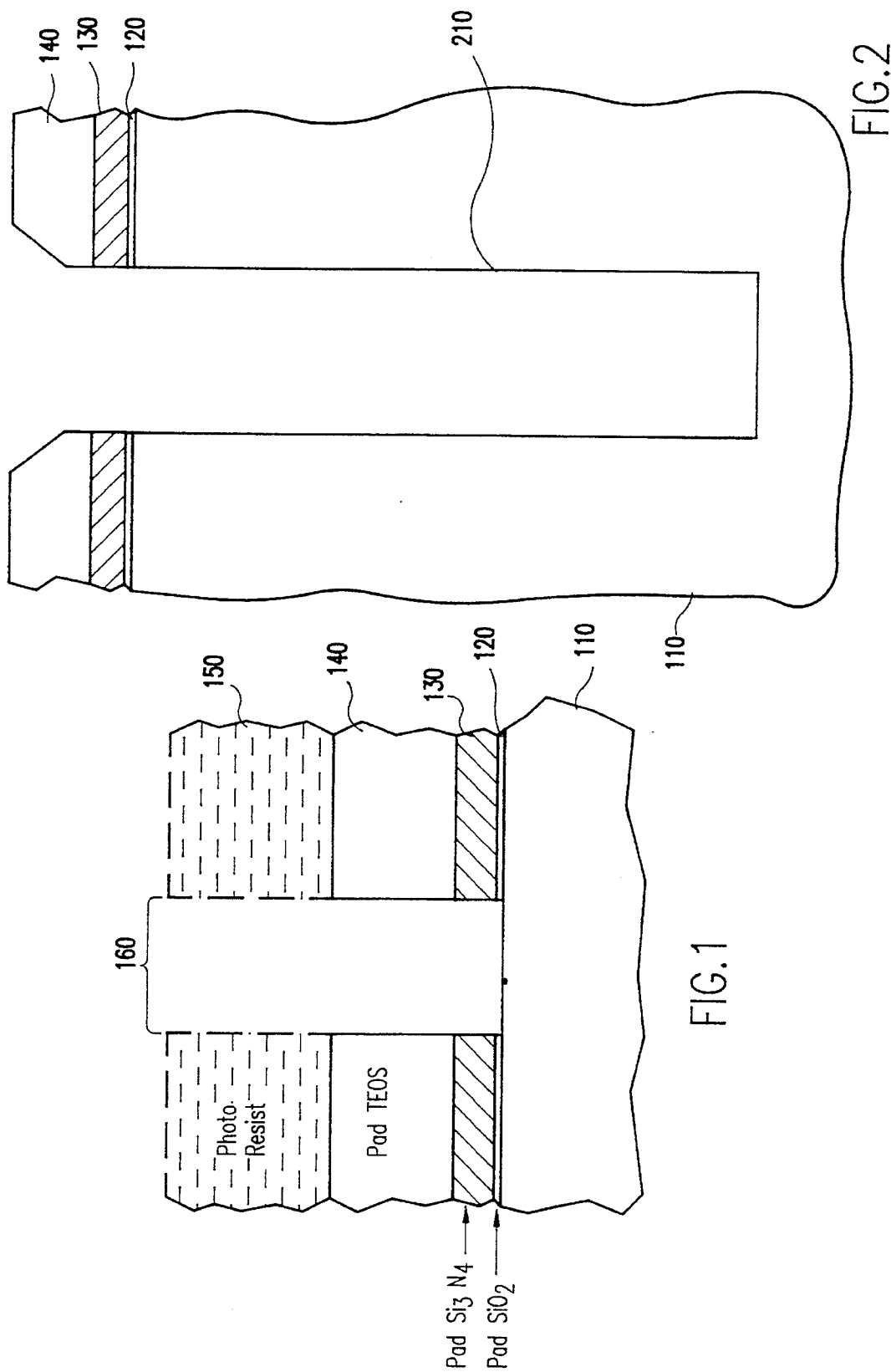

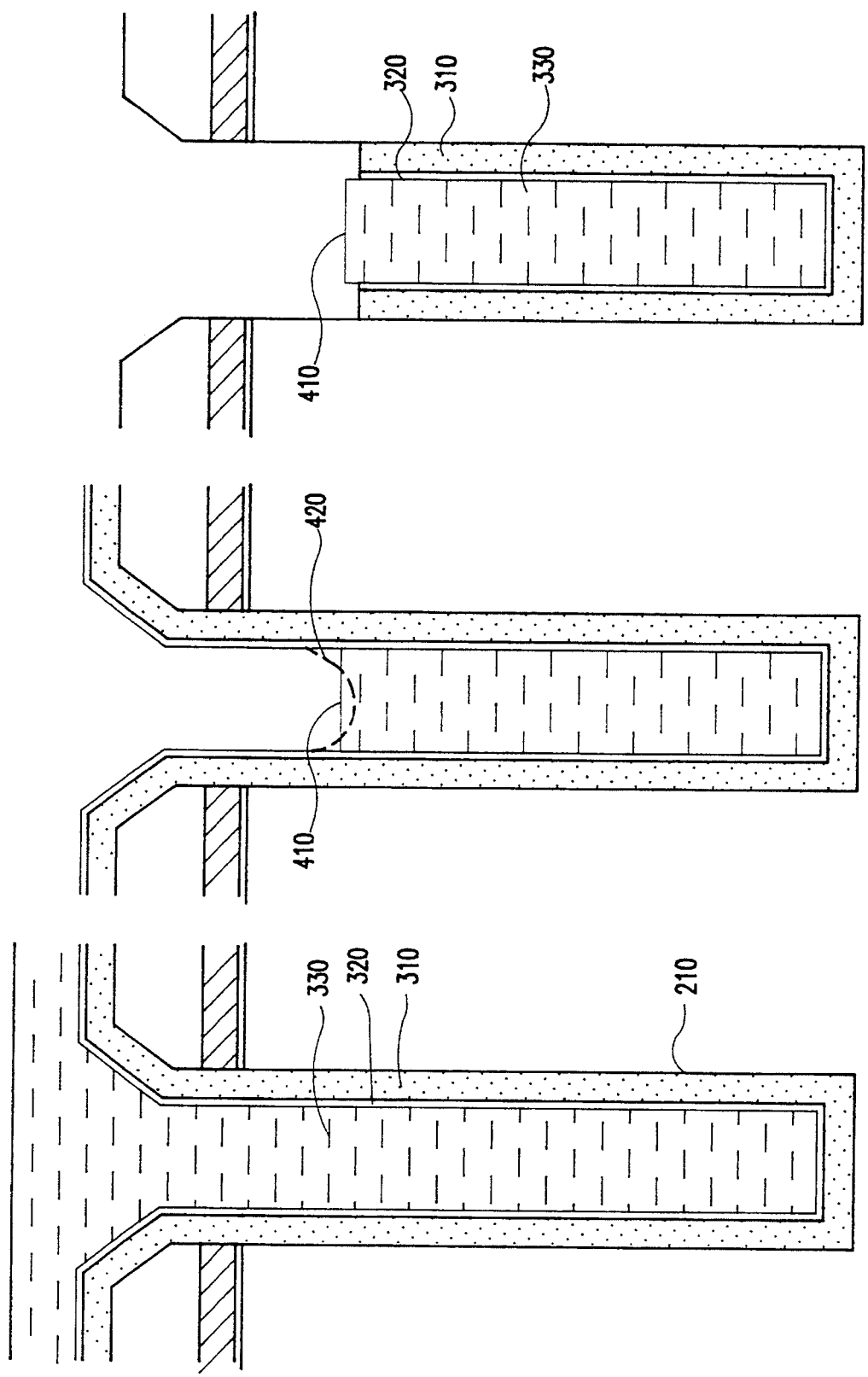

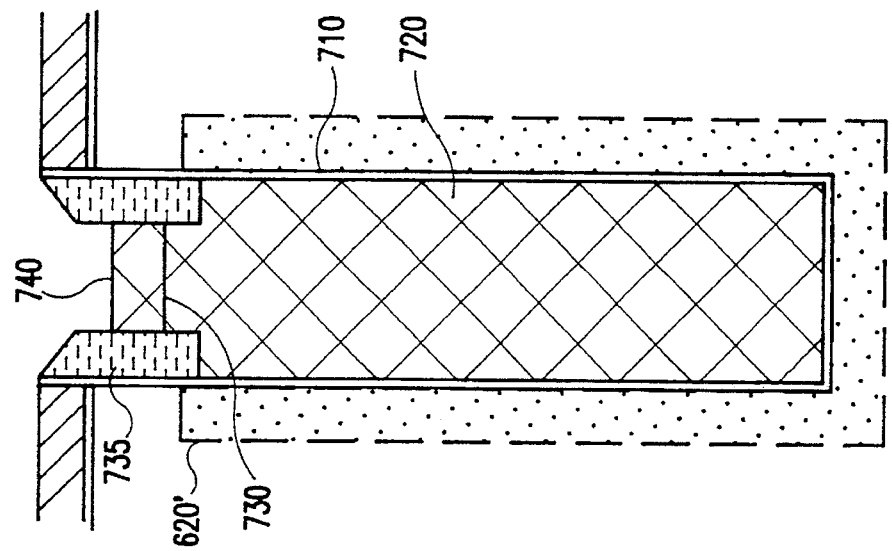
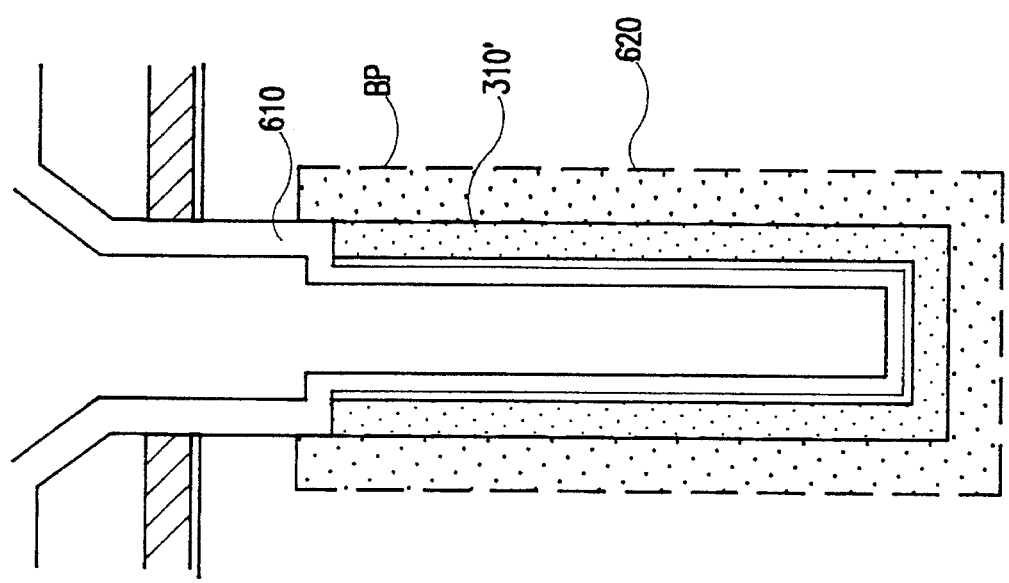

METHOD OF MAKING SINGLE-STEP TRENCHES USING RESIST FILL AND RECESS

DESCRIPTION

BACKGROUND OF THE INVENTION

1. Field of the Invention

The present invention generally relates to the formation of trenches in semiconductor substrates and, more particularly, to the formation of trench capacitors with a buried plate at extremely high integration densities.

2. Description of the Prior Art

High processing speed in currently available data processors must be supported by large amounts of high speed random access memory. Due to reduced device counts per memory cell, much of the required storage is provided by dynamic random access memories (DRAMs) so that a much greater number of memory cells can be provided on a single chip. In such devices, the density at which memory cells, principally comprising one storage capacitor per memory cell, is of great importance since the capacitance of each capacitor is very limited due to small size while that capacitance must be comparable to the capacitance of the word line and bit line to achieve adequate operating margins for the sense amplifiers used to detect the presence or absence of stored charge. Therefore, the trenches must be formed to relatively large depths while being very closely spaced. The same geometries are also important for other trench structures such as isolation trenches.

In recent years, it has also been the practice to provide a buried plate within the semiconductor substrate in which the trench capacitors are formed. A buried plate provides the capability of controlling the voltage on one plate of each of a plurality of capacitors rather than controlling the voltage on the substrate; the latter typically requiring relatively increased current. Altering the voltage on a plate of a plurality of capacitors during read or write operations can advantageously be used to increase operating margins. Further, as memory capacities have increased, it is often desirable to partition the memory by partitioning of the buried plate and the partitioning of the buried plate further reduces the current required to alter the voltage thereon. Independent control of voltage of the buried plate and the substrate also avoids interference or operational trade-offs between the capacitors of the memory and transistors in sense amplifiers and addressing circuits also formed on the substrate. Perhaps most importantly, however, the use of a buried plate allows limitation of the voltage across the capacitor dielectric to $V_{dd}/2$, potentially allowing reduction of trench depth and/or the use of a thinner capacitor dielectric layer.

While formation of a buried plate can be achieved by formation of a layer of doped polysilicon in the substrate prior to trench formation, the capacitance (and uniformity of capacitance) of the storage nodes is dependent on the positioning of capacitor plates across the capacitor dielectric. The coincidence of positioning can be most reliably achieved by the provision of a diffusion source in the trenches. This, in turn, has required etching to a depth above the capacitor plates (where no dopant diffusion is to occur) followed by a series of complex deposition steps to form diffusion barriers and isolation structures such as isolation collars. Then, a further etch to a depth corresponding to the capacitor plate dimensions was required followed by partial filling of the trenches with a doped material (e.g. silicon) to determine the depth or height of the capacitor within the trench and to function as a diffusion source. These processes were, in turn, followed by filling the remainder of the trench with an undoped or lightly doped semiconductor which functions as a diffusion barrier during manufacture and, later, as a contact.

However, in this multi-step process, referred to hereinafter as a two-step trench (although, in practice, a plurality of costly etch, deposition and etch back sequences are generally employed; the depth of the second etch corresponding to the capacitor plate dimensions being particularly difficult to control or perform repeatably), the highly doped material (e.g. polysilicon) has a tendency to oxidize, forming an insulating layer at the interface to the undoped or lightly doped material (either before or after the deposition of the undoped or lightly doped material) and can interrupt continuity to the capacitor plate serving as the storage node. Such interruption of continuity will not become evident until the memory array is substantially otherwise complete; reducing not only manufacturing yield but increasing the cost of chips which will ultimately be found defective and unusable.

Further, the two-step trench process inherently causes problems associated with step corners and barrier collar erosion. Step corners, formed by etching of the substrate or p-well laterally under the diffusion barrier or isolation collar often cause voids or crystal lattice dislocations, leading to capacitor leakage, while barrier collar erosion, caused by repeated deposition and etch back during formation of the highly doped diffusion source and the formation of a diffusion barrier thereover to prevent dopant diffusion in the upper regions of the trench, leads to a thinner and potentially irregular isolation collar with consequent reduction of the voltage which may be applied to the capacitor without breakdown.

Further in regard to step corner formation, while some lateral etching occurs laterally under the isolation collar, the isolation collar also restricts the etching process somewhat and reduces the transverse dimension of the lower portion of the trench; reducing the potential capacitance of the resulting capacitor for a given integration density and capacitor "footprint" (e.g. maximum transverse dimension of the trench). Additionally, regulation of depth of fill of the highly doped material is difficult when performed by deposition and etch back both from the standpoint of filling a very narrow trench and the fact that etching rates within a trench of sub-micron transverse dimension is highly dependent on trench dimensions, generally resulting in poor capacitance uniformity on a chip, across a wafer or from wafer to wafer. Nevertheless, prior to the present invention, the two-step trench structure has remained the methodology of choice for formation of trench capacitors having a buried plate at high integration densities.

SUMMARY OF THE INVENTION

It is therefore an object of the present invention to provide a simplified process for forming trench capacitors having a buried plate at high integration densities.

It is another object of the invention to provide a trench capacitor having a buried plate and method for formation of the same having an increased manufacturing yield and reliability.

It is a further object of the invention to provide a method for forming trench capacitors having a buried plate with improved capacitance uniformity over a chip, a wafer and a plurality of wafers.

It is yet another object of the invention to provide a single-step trench etch process for forming trench capacitors of high capacitance uniformity at high integration density.

It is yet another object of the invention to provide a trench capacitor of increased capacitance for a given integration density and maximum transverse trench dimension.

It is yet another object of the invention to provide a simplified method of formation of trench capacitors which avoids interruption of continuity at the diffusion source, the formation of step corners and isolation collar erosion and increases manufacturing yield at reduced process cost.

In order to accomplish these and other objects of the invention, a method of fabrication of a trench capacitor is provided including the steps of forming a trench in a substrate, forming a diffusion source layer within the trench, filling the trench with a resist, exposing and developing the resist to a depth less than a depth of the trench, etching said diffusion source in accordance with an unexposed portion of said resist, and completing said trench capacitor.

In accordance with another aspect of the invention, a method of fabrication of a trench structure with a buried connection adjacent thereto is provided including the steps of forming a trench in a substrate, forming a diffusion source layer within the trench, filling the trench with a resist, exposing and developing the resist to a depth less than a depth of said trench, etching the diffusion source in accordance with an unexposed portion of the resist, and diffusing impurities from the diffusion source into the substrate.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a cross-sectional view an early stage in the fabrication of a deep trench capacitor in accordance with the invention, FIG. 2 is a cross-sectional view showing formation of a trench, FIG. 3 is a cross-sectional view of the trench of FIG. 2 showing depositions therein in accordance with the invention, FIG. 4 is a cross-sectional view of the trench of FIG. 2 showing recessing of resist within the trench, FIG. 5 is a cross-sectional view showing etch back in accordance with recessed resist, FIG. 6 is a cross-sectional view showing formation of the buried plate, and FIG. 7 is a cross-sectional view of the completed trench capacitor in accordance with the invention.

DETAILED DESCRIPTION OF A PREFERRED EMBODIMENT OF THE INVENTION

Referring now to the drawings, and more particularly to FIG. 1, there is shown, in cross-section, an early stage in the fabrication of a trench capacitor in accordance with the invention. It is to be understood that while the invention is particularly advantageous in the fabrication of trench capacitors, with regard to which the invention will be explained by way of example, the methodology and novel aspects thereof are also applicable to other trench structures such as isolation trenches. Therefore, the following description of formation of a trench capacitor is given by way of example and not limitation.

To arrive at the structure shown in FIG. 1, a thin pad oxide 120 and pad nitride 130 are formed, in sequence, on substrate or p-well therein 110, for example, by deposition or other technique which is not critical to the practice of the invention. Subsequently, a relatively thick. blanket layer 140 of tetra ethyl ortho-silicate (TEOS) is applied followed by a blanket layer 150 of resist. Similarly the method of formation of the TEOS pad layer, the resist and the technique of patterning thereof, as shown at 160 are not critical to the practice of the invention. However, at the feature sizes and integration densities at which the invention may be practiced to greatest advantage, relatively short wavelength energy (e.g. i-line, medium ultra-violet (MUV) or shorter) is preferred for resist exposure, as will be understood by those skilled in the art.

After patterning of layers 140, 130 and 120 in accordance with the exposed and developed resist layer 150, the resist is removed and trench 210 is etched into substrate 110 in accordance with the patterned TEOS layer 140. as shown in FIG. 2. Then, as shown in FIG. 3, a layer 310 of arsenic doped glass (ASG) is conformally deposited within the trench 210, followed by a thin (e.g. 10–20 nm) layer 320 of undoped glass or ozone TEOS which functions as a seal or diffusion barrier over the ASG. The undoped glass layer also provides adhesion of resist with which the trench will be filled to prevent etching at voids along an interface of the resist and the ASG which would be otherwise formed if resist were to be directly deposited thereon. TEOS formed by plasma enhanced vapor deposition (PECVD), PECVD oxide or in-situ deposited CVD undoped TEOS film can also be used.

After this thin film is deposited, hexamethyl disilazane (HMDS) is evaporated to form a monolayer on the oxide surface and a blanket layer of resist is deposited and reflowed. Spectralith resist (IBM proprietary) or other Novolak resin (commercially available) based resist is preferred because these resists exhibit a comparative lack of thermal stability (e.g. having a low glass transition temperature or melting point, allowing reflow, below the temperature at which photosensitivity is lost). (While such resists are generally applied to productions of features of larger feature size than those to which the invention is most advantageously applied, relatively low resolution of the resist is unimportant to the practice of the basic principles of the invention since the resist is deposited in a patterned trench. Further, in accordance with a perfecting feature of the preferred form of the invention, while the above mentioned exemplary resists are most sensitive to i-line wavelengths, it is preferred to adjust sensitivity of the resist by baking (sensitivity decreases with increased time and temperature of the bake) and to expose this resist with very short (e.g. DUV or e-beam) energy, as will be discussed in detail below, at which relatively high effective resolution can be obtained while avoiding diffraction effects within sub-micron sized trenches which would occur at longer wavelengths of exposure energy.) Comparative lack of thermal stability is important to the practice of the invention in order to achieve reflow of the resist at an elevated temperature following deposition in order to fill the trenches reliably. In practice, no voids or seams are generally present after such reflow.

The resist 330 is then recessed to about 1.5 microns below the substrate surface by exposure and development, as shown at 410 of FIG. 4. The buried plate location corresponding initially to the resist recess depth can also be adjusted when the P-well depth or drive-in cycle are changed. It is considered important to the practice of the invention to achieve uniformity of resist recessing to adjust the exposure sensitivity of the resist by baking at an elevated temperature. the baking can, of course, be advantageously combined with the elevated temperature processing used to achieve reflow of the resist. For example, for the Spectralith resist alluded to above, a 2.3 micron layer of resist is applied and baked at 95° C. for two minutes. Then, temperature is increased to 120° C. for an additional two minutes to achieve reflow. Such baking processes will vary depending on the particular resist used as will be understood by those skilled in the art in view of this disclosure but the above and similar baking and reflow processes (which may be combined), has been found to develop good uniformity of depth of resist removal after exposure by i-line, MUV or shorter wavelength energy. If uniform, depth of resist removal is relatively non-critical but should be greater than the diffusion length of arsenic over the remaining heat budget of the manufacturing process and greater than the separation between trenches in a memory array so that the impurities constituting the buried plate will not reach the surface of the substrate as will be evident from the detailed discussion of FIGS. 5 and 6, below.

The appropriate blanket exposure dose to achieve recessing of resist to a suitable depth will be apparent to those skilled in the art. As a perfecting feature of the invention, however, it is preferred to make the exposure with very short wavelength energy, such as an e-beam in order to avoid diffraction effects within the trenches from the exposure. A suitable e-beam exposure dose (for Spectralith, baked and reflowed as discussed above) of 200 microcoulombs at an accelerating voltage of 11 KeV and a beam current of 12 milliamperes in a chamber at a pressure of 36 mTorr achieves a uniform 1.8 micron resist recess when developed for 210 seconds in IBM 2401 developer at 1:3.5 dilution. For e-beam exposure, depth of exposure and the resulting recess is principally a function of electron energy or accelerating voltage which can be controlled very accurately and is highly uniform across a wafer and highly repeatable on successive wafers. Other exposure doses (e.g. at longer wavelengths) and developer materials, processes and times may be approximated from this preferred dosage and development based on resist transparency and scattering, resist sensitivity at the chosen exposure wavelength and similar well-recognized factors. After development of the resist, a further baking operation for two minutes at 95° C. to drive off moisture is preferably performed.

It should be recognized that e-beam exposure is not necessary to the successful practice of the invention even to very high integration densities. For example, i-line (referenced to the emission spectrum of mercury) or, preferably, MUV energy is sufficient to fabrication of at least 64-Mbyte DRAMs in accordance with the invention, particularly if the diffraction effects can be reduced by trench shape (e.g. rectangular or oval rather than square or round). However, the avoidance of diffraction effects within the trenches results in a relatively flat-bottomed resist recess 410 for comparable trench densities and yields improved uniformity of capacitance and regularity of buried plate formation. (A profile of resist recess which would be formed by i-line or MUV exposure is shown by dashed line 420 in FIG. 4 for comparison.) Alternatively or in combination with such an effect, e-beam exposure can be used to extend practice of the invention to higher integration densities and smaller trench sizes at which diffraction effects occur to a comparable degree. That is, e-beam exposure will provide uniform exposure into the smallest trenches which can be formed by optical lithography and is likely to provide an operable device even if the trenches are also formed by e-beam (e.g sub-optical wavelength) lithography. This principle of the preferred perfecting feature of the invention is, in theory, extendable to even shorter wavelengths.

It should also be understood that any electron beam sensitive resist having a glass transition temperature below that which eliminates or excessively reduces e-beam sensitivity can be used in the preferred form of the invention. Substantial reduction in e-beam sensitivity can be compensated with increased e-beam exposure dose. Reflow of resist becomes of increasing importance at high integration densities since virtually no resist will enter half-micron trenches during the initial application of resist. Further, while no seams or voids are formed during reflow in accordance with the process discussed above, some voids at depths within the trench exceeding the recess depth may be tolerable and it may not be necessary to fill the trenches completely although increased reliability of the process and increased manufacturing yield is to be expected when trench filling is complete.

Referring now to FIG. 5, layers 310 and 320 are etched back in accordance with the resist recess 410, preferably with buffered hydrofluoric acid (BHF) diluted to 7:1, 10:1 or 40:1. These layers are of similar material and exhibit comparable etch rates for most etchants and it is only important to the practice of the invention that the etch be achieved selectively with respect to the remaining resist 330. It is also preferred that the etch be isotropic which results in a recessing of the ASG layer 310 slightly below the resist recess 410.

Then, as shown in FIG. 6, the remaining resist fill 330 in the trenches is removed and a sacrificial oxide (e.g. grown at 800° C. or lower to prevent significant diffusion from the ASG during such growth), ozone TEOS or similar material layer is formed to prevent doping of the upper regions of the trench during subsequent impurity diffusion from the ASG layer 310. A thickness of 20–150 nm is sufficient for this purpose. Impurity diffusion or drive-in from the ASG into the substrate 110 or p-well therein is then carried out to substantially form the buried plate 620 in accordance with the location of the remaining ASG 310'. Suitable times and temperatures for the drive-in are three hours at 1050° C. or one hour at 1100° C.

After initial drive-in, film 610 and the remaining layers 310', 320' are removed, preferably using BHF and a capacitor dielectric 710, preferably an oxide-nitride-oxide (ONO) sequence of layers, is formed by known techniques and the trench filled with N+ polysilicon or other suitable material 720, as shown in FIG. 7. Reactive ion etching is then used to recess the fill about 1.2 μm below the substrate surface (e.g. to 730). The pad oxide, nitride and TEOS films 120, 130, 140 may then be stripped and an isolation collar 735 of deep trench (DT) TEOS formed. The remaining portion of the trench is again filled with N+ polysilicon or other suitable material and recessed slightly (e.g. 50–100 nm) by RIE or other suitable etching process to yield the substantially complete trench capacitor structure shown in FIG. 7. A contact of any suitable material can then be placed within the isolation collar. It should be noted that both trench filling processes are carried out in an opening the full width of the trench or remaining portion thereof so that no step corners are formed. Similarly, it should be appreciated that only a relatively short RIE step is carried out after formation of the isolation collar 740 and no significant erosion occurs. Further, it should be understood that the remaining heat budget during fill causes further diffusion of impurities forming the buried plate, as shown at 620', and which advantageously reaches the corresponding region of an adjacent trench to merge into a continuous conductive layer but without reaching the surface of the substrate or p-well.

In view of the foregoing, it is seen that the method and apparatus in accordance with the invention forms a trench capacitor with a buried plate by a simplified and high yield process at high integration densities and with increased capacitance and improved capacitance uniformity over a chip, wafer or from wafer to wafer by a single-step trench etch process while avoiding problems associated with step corners and isolation collar erosion. The filling of the trenches with resist having low thermal stability (e.g. comparatively low glass transition temperature) by reflow allows recess of the resist to a highly uniform depth allows the buried plate to be formed easily within a trench formed by a single etching step. Doping of the upper regions of the trench is readily prevented during the drive-in cycle by the sacrificial oxide or TEOS readily formed within the trench, advantageously by growth at a temperature somewhat below the temperature of the drive-in cycle, with which it can be combined. The perfecting feature of using short wavelength energy for exposure of resist fill in the trench allows the principles and process of the invention to be extended to increased integration densities as well as increasing capacitance and buried plate uniformity.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of fabrication of a trench capacitor including the steps of forming a trench in a substrate, forming a diffusion source layer within said trench, filling said trench with a resist, exposing and developing said resist to a depth less than a depth of said trench, etching said diffusion source in accordance with an unexposed portion of said resist, and completing said trench capacitor.

2. A method as recited in claim 1, including the further step of applying a layer of material over said diffusion source layer for enhancing adhesion of said resist within said trench.

3. A method as recited in claim 1, wherein said step of filling said trench with resist includes the further step of reflowing said resist.

4. A method as recited in claim 1, including the further step of adjusting exposure sensitivity of said resist.

5. A method as recited in claim 4, wherein said step of adjusting exposure sensitivity includes a step of baking said resist.

6. A method as recited in claim 1, wherein said step of forming said trench within said substrate is performed by a single etching operation.

7. A method as recited in claim 1, wherein said step of forming said trench is performed by lithography at a first wavelength and said step of exposing said resist is performed at a second wavelength, said second wavelength being shorter than said first wavelength.

8. A method as recited in claim 4, wherein said step of forming said trench is performed by lithography at a first wavelength and said step of exposing said resist is performed at a second wavelength, said second wavelength being shorter than said first wavelength.

9. A method as recited in claim 3, including the further step of baking said resist and wherein a process step for baking said resist is combined with a process step for reflowing said resist.

10. A method as recited in claim 9 wherein said step of baking said resist and reflowing said resist serve to adjust exposure sensitivity of said resist.

11. A method as recited in claim 7, wherein said step of exposing said resist is performed with an electron beam.

12. A method as recited in claim 11, including the further step of controlling an accelerating voltage of said electron beam such that said resist is exposed to a depth less than the depth of said trench.

13. A method of fabrication of a trench structure with a buried connection adjacent thereto including the steps of forming a trench in a substrate, forming a diffusion source layer within said trench, filling said trench with a resist, exposing and developing said resist to a depth less than a depth of said trench, etching said diffusion source in accordance with an unexposed portion of said resist, and diffusing impurities from said diffusion source into said substrate.

14. A method as recited in claim 13, including the further step of applying a layer of material over said diffusion source layer for enhancing adhesion of said resist within said trench.

15. A method as recited in claim 13, wherein said step of filling said trench with resist includes the further step of reflowing said resist.

16. A method as recited in claim 13, including the further step of adjusting exposure sensitivity of said resist.

17. A method as recited in claim 13 wherein said step of forming said trench is performed by lithography at a first wavelength and said step of exposing said resist is performed at a second wavelength, said second wavelength being shorter than said first wavelength.

18. A method as recited in claim 15, including the further step of baking said resist and wherein a process step for baking said resist is combined with a process step for reflowing said resist.

19. A method as recited in claim 18 wherein one of a step of baking said resist and a step of reflowing said resist serve to adjust exposure sensitivity of said resist.

20. A method as recited in claim 13, wherein said step of exposing said resist includes the further step of exposing said resist with an electron beam and controlling an accelerating voltage of said electron beam such that said resist is exposed to a depth less than the depth of said trench.

* * * * *